US009276061B2

(12) United States Patent  
Yano

(10) Patent No.: US 9,276,061 B2  
(45) Date of Patent: Mar. 1, 2016

(54) DIODE AND SIGNAL OUTPUT CIRCUIT INCLUDING THE SAME

(71) Applicant: Rohm Co., Ltd., Kyoto (JP)

(72) Inventor: Yuji Yano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/561,489

(22) Filed: Dec. 5, 2014

(65) Prior Publication Data

US 2015/0162400 A1  Jun. 11, 2015

(30) Foreign Application Priority Data

Dec. 9, 2013  (JP) ................................. 2013-254396

(51) Int. Cl.
| | |
|---|---|
| H01L 29/861 | (2006.01) |
| H01L 29/06 | (2006.01) |
| H01L 29/36 | (2006.01) |
| H01L 27/06 | (2006.01) |

(52) U.S. Cl.
CPC .......... *H01L 29/0619* (2013.01); *H01L 29/861* (2013.01); *H01L 27/0629* (2013.01); *H01L 29/0646* (2013.01); *H01L 29/0649* (2013.01); *H01L 29/36* (2013.01)

(58) Field of Classification Search
CPC .............. H01L 27/0629; H01L 27/067; H01L 29/0619; H01L 29/861
See application file for complete search history.

(56) References Cited

U.S. PATENT DOCUMENTS

| | | | | |
|---|---|---|---|---|
| 5,156,989 | A | * | 10/1992 | Williams .............. H01L 21/761 148/DIG. 85 |
| 5,614,755 | A | * | 3/1997 | Hutter ................. H01L 21/8249 257/471 |
| 6,927,452 | B2 | * | 8/2005 | Shin ...................... H01L 21/761 257/335 |
| 7,064,407 | B1 | * | 6/2006 | Mallikarjuna-swamy ................ H01L 27/0727 257/287 |
| 7,745,845 | B2 | * | 6/2010 | Cai ......................... H01L 29/10 257/119 |
| 7,804,135 | B2 | * | 9/2010 | Jensen ................ H01L 27/0255 257/197 |
| 8,735,950 | B2 | * | 5/2014 | Chen ..................... H01L 29/872 257/272 |
| 9,129,990 | B2 | * | 9/2015 | Chen ................. H01L 29/66659 |
| 2012/0112240 | A1 | * | 5/2012 | Takeda ................ H01L 29/0873 257/133 |
| 2015/0228808 | A1 | * | 8/2015 | Liao ....................... H01L 29/872 257/484 |

FOREIGN PATENT DOCUMENTS

JP       2011-250345       12/2011

* cited by examiner

*Primary Examiner* — Allan R Wilson  
(74) *Attorney, Agent, or Firm* — Fish & Richardson P.C.

(57) ABSTRACT

A diode includes: a p-type semiconductor substrate; an n-type semiconductor layer; a p-type isolation region formed to surround a predetermined region of the n-type semiconductor layer on the p-type semiconductor substrate; an n-type buried layer formed across the p-type semiconductor layer and the n-type semiconductor layer within the predetermined region; an n-type collector wall formed in the n-type semiconductor layer; a p-type anode region and a plurality of n-type cathode regions formed in a diode formation region; and a p-type guard ring formed to surround the diode formation region in a region between the diode formation region of the surface layer of the n-type semiconductor layer and the p-type isolation region. A transistor for reducing a leakage current is formed by the p-type anode region, the p-type guard ring, and an n-type semiconductor between the p-type anode region and the p-type guard ring.

9 Claims, 9 Drawing Sheets

DIODE AND SIGNAL OUTPUT CIRCUIT INCLUDING THE SAME

CROSS-REFERENCE TO RELATED APPLICATIONS

This application is based upon and claims the benefit of priority from Japan Patent Applications No. 2013-254396, filed on Dec. 9, 2013, the entire contents of which are incorporated herein by reference.

TECHNICAL FIELD

The present disclosure relates to a diode and a signal output circuit including the same.

BACKGROUND

A conventional diode used in a signal output device of a vehicle-mounted network has been known. Such a diode includes a p-type semiconductor substrate, an n-type semiconductor layer formed on the p-type semiconductor substrate, p-type isolation regions formed to surround a certain region of the n-type semiconductor layer on the p-type semiconductor substrate, an n-type buried layer formed across the p-type semiconductor substrate and the n-type semiconductor layer within the certain region, an n-type collector wall formed on the-type semiconductor layer and standing on a peripheral edge of an upper surface of the n-type buried layer toward a surface of the n-type semiconductor layer, and a p-type anode region and an n-type cathode region formed in a diode formation region within a region surrounded by the n-type collector wall of a surface layer of the n-type semiconductor layer.

In the foregoing conventional diode, a longitudinal PNP parasitic transistor is formed by an n-type semiconductor including the p-type anode region to which an anode is connected, the p-type semiconductor substrate, and the n-type buried layer between the p-type anode region and the p-type semiconductor substrate. In addition, a transverse PNP parasitic transistor is formed by an n-type semiconductor including the p-type anode region to which the anode is connected, the p-type isolation region, and the collector wall between the p-type anode region and the p-type isolation region. Since a current path is formed by such parasitic transistors, a leakage current flows in the p-type semiconductor substrate.

SUMMARY

The present disclosure provides some embodiments of a diode having a reduced amount of leakage current and a signal output circuit including the same.

According to one embodiment of the present disclosure, there is provided a diode including a p-type semiconductor substrate; an n-type semiconductor layer formed on the p-type semiconductor substrate; a p-type isolation region formed to surround a predetermined region of the n-type semiconductor layer on the p-type semiconductor substrate; an n-type buried layer formed across the p-type semiconductor layer and the n-type semiconductor layer within the predetermined region and having an impurity concentration higher than an impurity concentration of the n-type semiconductor layer; an n-type collector wall formed in the n-type semiconductor layer, standing on the n-type buried layer toward a surface of the n-type semiconductor layer to surround the predetermined region of the n-type semiconductor layer, and having an impurity concentration higher than the impurity concentration of the n-type semiconductor layer; a p-type anode region and a plurality of n-type cathode regions formed in a diode formation region, which is defined within a region surrounded by the n-type collector wall in a surface layer of the n-type semiconductor layer; and a p-type guard ring formed to surround the diode formation region in a region between the diode formation region of the surface layer of the n-type semiconductor layer and the p-type isolation region, and electrically connected to the cathode region. In addition, a transistor for reducing a leakage current is formed by the p-type anode region, the p-type guard ring, and an n-type semiconductor between the p-type anode region and the p-type guard ring.

In this configuration, a PNP transistor for reducing a leakage current is formed by the p-type anode region, the p-type guard ring, and an n-type semiconductor formed between the p-type anode region and the p-type guard ring. The p-type guard ring is connected to a cathode electrode such that a current flowing in the PNP transistor for reducing a leakage current is collected by the cathode electrode. The p-type guard ring, which serves as a collector of the PNP transistor for reducing a leakage current, is disposed at an inner side of the p-type isolation region. Thus, currents that intend to flow from within the diode formation region toward the p-type isolation region are mostly collected by the cathode electrode by means of the PNP transistor for reducing a leakage current. As a result, a diode having a reduced amount of leakage current can be realized.

In one embodiment, the p-type guard ring is formed to surround the diode formation region in a region between the diode formation region of the surface layer of the n-type semiconductor layer and the n-type collector wall, and the n-type semiconductor includes the n-type semiconductor layer.

In one embodiment, the p-type guard ring is formed to surround the diode formation region in a region between the n-type collector wall and the p-type isolation region, and the n-type semiconductor includes the n-type semiconductor layer and the n-type collector wall.

In one embodiment, a longitudinal parasitic PNP transistor is formed by the p-type anode region, the p-type semiconductor substrate, and the n-type semiconductor layer and the n-type buried layer between the p-type anode region and the p-type semiconductor substrate, and a transverse parasitic PNP transistor is formed by the p-type anode region, the p-type isolation region, and the n-type semiconductor layer and the n-type collector between the p-type anode region and the p-type isolation region.

A current amplification factor of the longitudinal PNP parasitic transistor may be easily lowered by setting a high impurity concentration of the n-type buried layer. On the other hand, since the n-type collector wall extends in a longitudinal direction (i.e., a normal direction of the surface of the p-type semiconductor substrate), it may be difficult to set a high impurity concentration across the entire region. Thus, if the current amplification factor of the longitudinal PNP parasitic transistor is sought to be reduced, a current amplification factor of the transverse parasitic PNP transistor becomes higher than that of the longitudinal PNP parasitic transistor. Accordingly, a leakage current by the transverse PNP parasitic transistor is greater than a leakage current by the longitudinal PNP parasitic transistor.

In this configuration, the p-type guard ring, which serves as a collector of the PNP transistor for reducing a leakage current, is disposed at an inner side of the p-type isolation region, which serves as a collector of the transverse parasitic PNP transistor. Thus, currents that intend to flow from within the diode formation region toward the p-type isolation region are mostly collected in the cathode electrode by means of the PNP transistor for reducing a leakage current. Accordingly, a current flowing in the transverse parasitic PNP transistor can be suppressed such that a diode having a reduced amount of leakage current can be realized.

In one embodiment, a current amplification factor of the transverse parasitic PNP transistor is higher than a current amplification factor of the longitudinal parasitic PNP transistor.

In one embodiment, a current amplification factor of the transistor for reducing a leakage current is higher than a current amplification factor of the longitudinal parasitic PNP transistor.

In one embodiment, a diode structure including the p-type anode region and the n-type cathode regions is formed in the diode formation region, and the diode structure has an n-channel DMIS transistor structure.

In one embodiment of the present disclosure, the diode structure includes the p-type anode region formed in the surface layer of the n-type semiconductor layer; an n-type region and a p-type contact region formed in a surface layer of the p-type anode region; the n-type cathode regions formed in the surface layer of the n-type semiconductor layer and disposed to be spaced apart from both sides of the p-type anode region; an n-type contact region formed in surface layers of the n-type cathode regions; a gate insulating film formed on a surface of the n-type semiconductor layer in a region between the n-type region and the n-type contact region; and a gate electrode formed on the gate insulating film, and electrically connected to the anode region.

In another embodiment, provided is a signal output circuit, including an output terminal; the diode; and a switching element connected between a cathode of the diode and a ground. An anode of the diode is connected to the output terminal. With this configuration, since a leakage current of the diode is small, a current flowing from an output terminal to a ground through the diode can be suppressed when a switching element is turned off. Accordingly, when the switching element is turned off, the output terminal can output an appropriate output signal.

DETAILED DESCRIPTION

Hereinafter, embodiments of the present disclosure will be described in detail with reference to the drawings.

Figure 1:
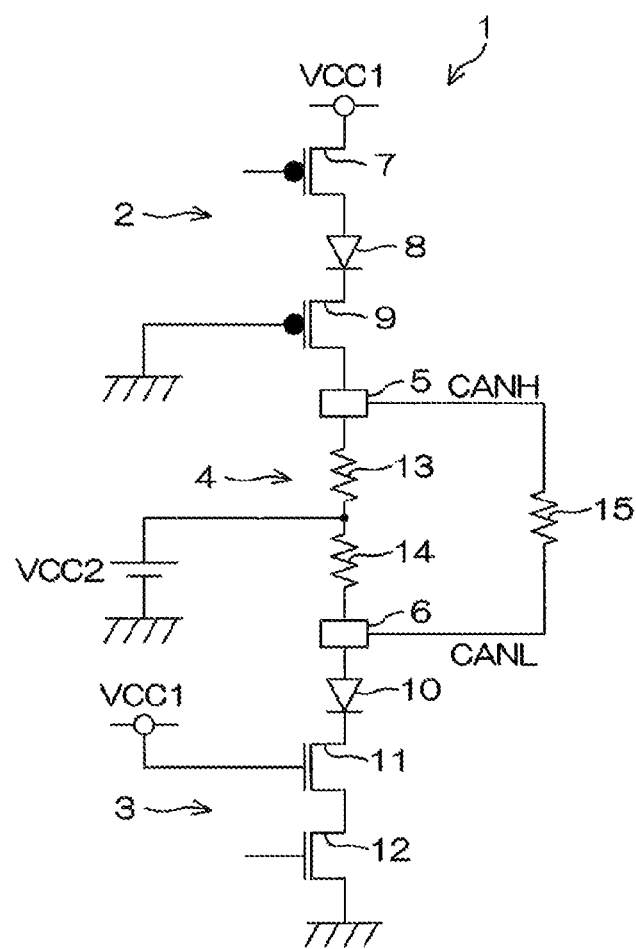
FIG. 1 illustrates an electric circuit diagram of a signal output circuit employing a diode, according to a first embodiment of the present disclosure.

FIG. 1 illustrates an electric circuit diagram of a signal output circuit employing a diode, according to a first embodiment of the present disclosure. A signal output circuit 1 is, for example, a signal output circuit used in a controller area network (CAN), which is a type of a vehicle-mounted network. The signal output circuit 1 includes a high-side output unit 2, a low-side output unit 3, a resistance dividing circuit 4, a high-side output terminal 5, and a low-side output terminal 6.

The high-side output unit 2 includes a driving transistor 7, a backflow prevention diode 8 connected in series to the driving transistor 7, and a protection transistor 9 connected in series to the backflow prevention diode 8. In this embodiment, the driving transistor 7 and the protection transistor 9 may be configured as p-type MOS transistors (PMOS). A source of the driving transistor 7 is connected to a first power source VCC1. A drain of the driving transistor 7 is connected to an anode of the backflow prevention diode 8. A cathode of the backflow prevention diode 8 is connected to a source of the protection transistor 9. A drain of the protection transistor 9 is connected to the high-side output terminal 5. A gate of the protection transistor 9 is grounded.

The low-side output unit 3 includes a backflow prevention diode 10, a protection transistor 11 connected in series to the backflow prevention diode 10, and a driving transistor 12 connected in series to the protection transistor 11. In this embodiment, the protection transistor 11 and the driving transistor 12 may be configured as n-type MOS transistors (NMOS). An anode of the backflow prevention diode 10 is connected to the low-side output terminal 6. A cathode of the backflow prevention diode 10 is connected to a drain of the protection transistor 11. A gate of the protection transistor 11 is connected to a first power source VCC1. A source of the protection transistor 11 is connected to a drain of the driving transistor 12. A source of the driving transistor 12 is grounded.

The resistance dividing circuit 4 includes a first resistor 13 having one end connected to the high-side output terminal 5 and a second resistor 14 having one end connected to the other end of the first resistor 13. The other end of the second resistor 14 is connected to the low-side output terminal 6. A second power source VCC2 is connected to a connection point between the first resistor 13 and the second resistor 14. The high-side output terminal 5 is connected to a first bus line, and the low-side output terminal 6 is connected to a second bus line. A termination resistor 15 is connected between the first bus line and the second bus line.

A control signal is given to a gate of the driving transistor 7, and an inversion signal of the control signal is given to a gate of the driving transistor 12. When the control signal has a low (L) level, both driving transistors 7 and 12 are turned on. Thus, a bus signal CANH having 3.5V (standard value) is output at the high-side output terminal 5, and a bus signal CANL having 1.5 V (standard value) is output at the low-side output terminal 6 (dominant state). On the other hand, when the control signal has a high (H) level, both driving transistors 7 and 12 are turned off. Thus, a bus signal CANH having 2.5 V (standard value) is output at the high-side output terminal 5, and a bus signal CANL having 2.5 V (standard value) is output at the low-side output terminal (recessive state).

The backflow prevention diode 10 of the low-side output unit 3 may be configured as a diode of the first embodiment of the present disclosure. When a large amount of leakage current is flowing from the backflow prevention diode 10, a current flows from the low-side output terminal 6 to a ground through the backflow prevention diode 10, even though the driving transistor 12 is turned off. As such, the bus signals CANH and CANL may deviate from the standard values. Thus, a diode of this embodiment that generates a small amount of leakage current may be used as the backflow prevention diode 10 of the low-side output unit 3. A structure of the backflow prevention diode 10 (hereinafter, "diode 10") will be described in detail below.

Figure 2:
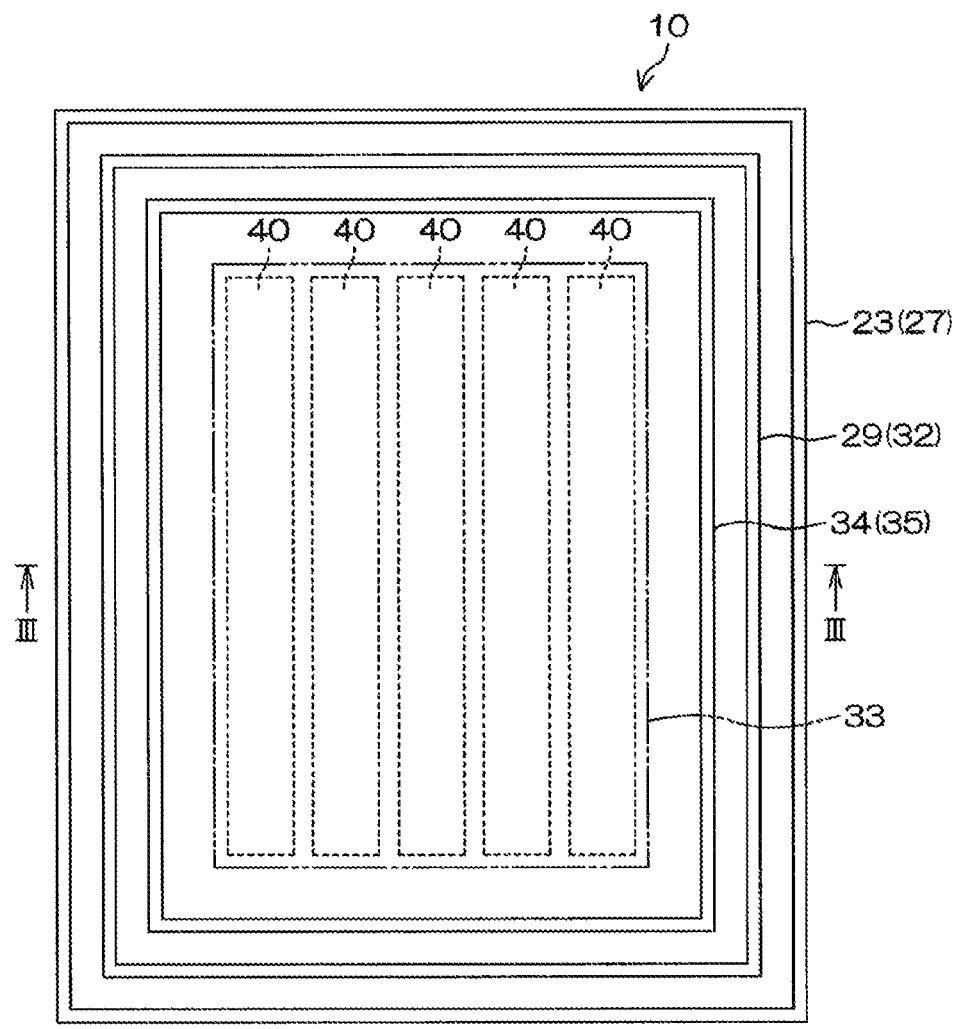
FIG. 2 illustrates a schematic plan view illustrating a structure of the diode according to the first embodiment of the present disclosure.
Figure 3:
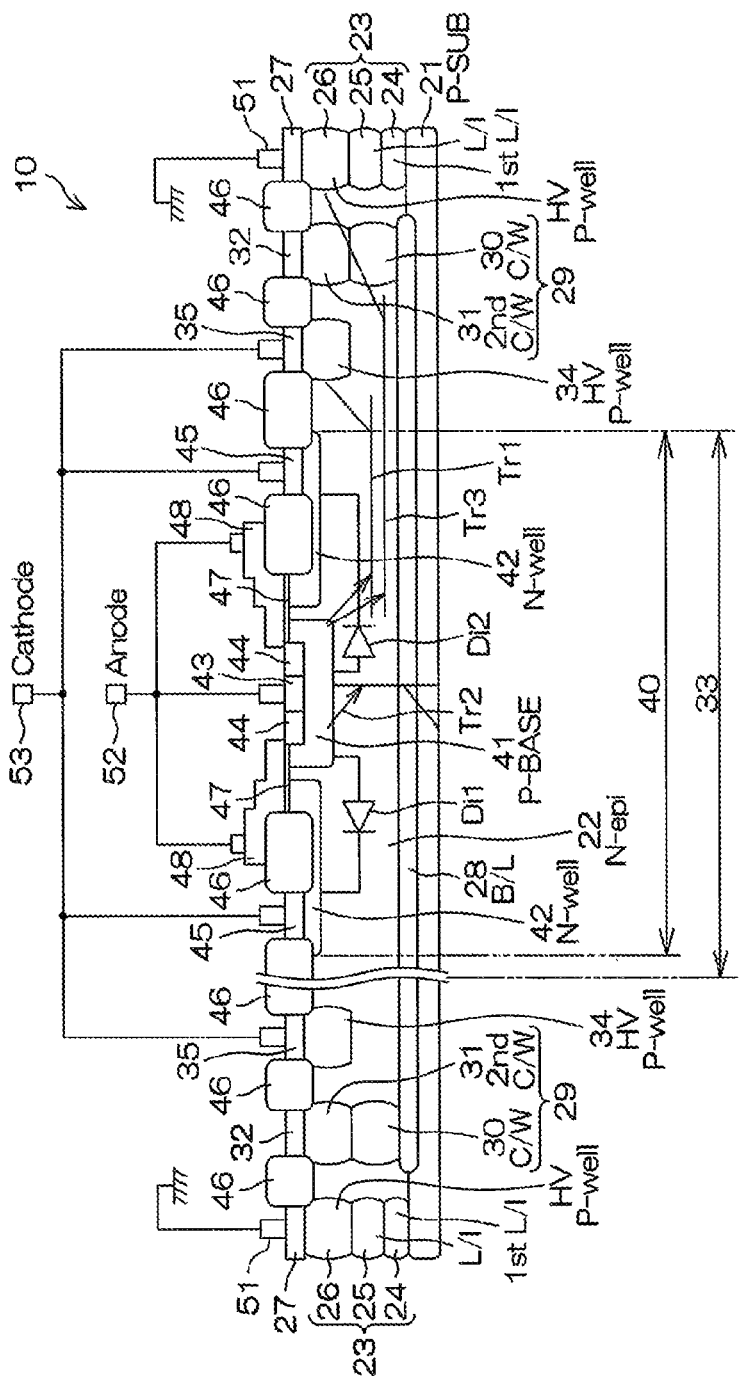
FIG. 3 illustrates a cross-sectional view taken along line III-III of FIG. 2.

FIG. 2 illustrates a schematic plan view indicative of a structure of the diode 10, according to a first embodiment of the present disclosure. FIG. 3 illustrates a cross-sectional view taken along line III-III of FIG. 2. As shown in FIG. 2, for example, the diode 10 has a quadrangular chip shape in a plan view. The diode 10 includes a p-type semiconductor substrate (P-SUB) 21. An n-type epitaxial layer (N-epi) 22 is stacked as an n-type semiconductor layer on the surface of the p-type semiconductor substrate 21. In addition, a p-type isolation region 23, which has a quadrangular annular shape and surrounds the n-type epitaxial layer 22, is formed on the surface of the p-type semiconductor substrate 21.

The p-type isolation region 23 includes a lower isolation region ($1^{st}$ L/I (Low Isolation)) 24 connected to the p-type semiconductor substrate 21, a middle isolation region (L/I) 25 formed on the lower isolation region 24, and an upper isolation region (HV P-well) 26 formed on the middle isolation region 25. A $p^+$-type substrate contact region 27 is formed in an upper layer of the upper isolation region 26. A grounded substrate electrode 51 is connected to the $p^+$-type substrate contact region 27.

In a boundary between the n-type epitaxial layer 22 and the p-type semiconductor substrate 21, an n-type buried layer (B/L) 28 having an impurity concentration higher than that of an n-type epitaxial layer 22 is formed across the p-type semiconductor substrate 21 and the n-type epitaxial layer 22. Also, an n-type collector wall 29, which stands on a peripheral edge of an upper surface of the n-type buried layer 28 toward a surface of the n-type epitaxial layer 22 and has an impurity concentration higher than that of the n-type epitaxial layer 22, is formed in the n-type epitaxial layer 22.

The n-type collector wall 29 includes a lower collector wall (C/W) 30 connected to the p-type semiconductor substrate 21, and an upper collector wall ($2^{nd}$ C/W) 31 formed on the lower collector wall 30. An $n^+$-type layer 32 is formed in an upper layer of the upper collector wall ($2^{nd}$ C/W) 31. A diode formation region 33, which has a quadrangular shape as illustrated in the plan view of FIG. 2, is defined within a region (n-type epitaxial layer 22) surrounded by the n-type buried layer 28 and the n-type collector wall 29. Also, a p-type well 34 is formed in a surface layer of the n-type epitaxial layer 22 as a p-type guard ring to surround the diode formation region 33 in a region between the diode formation region 33 and the n-type collector wall 29. A $p^+$-type cathode contact region 35 is formed in a surface layer of the p-type well 34.

As shown in FIG. 2, a plurality of diode structures 40, each of which has the same structure, is formed in a surface layer of the n-type epitaxial layer 22 within the diode formation region 33. Each of the diode structures 40 extends in a predetermined direction (a vertical direction on the paper of FIG. 2), as illustrated in the plan view of FIG. 2. The plurality of diode structures 40 extends to be parallel with each other while being spaced apart from each other by a predetermined interval. Thus, such diode structures 40 are formed in a stripe shape, as illustrated in the plan view of FIG. 2. In the first embodiment, each of the diode structures 40 has an n-channel DMIS transistor structure. FIG. 3 is illustrated with only a single diode structure 40, which may be located at one end of the diode formation region 33, among the plurality of diode structures 40.

As shown in FIG. 3, the diode structure 40 includes a p-type well (P-BASE) 41 formed in a surface layer of the n-type epitaxial layer 22 as an anode region (p-type body region), and two n-type wells (N-well) 42 formed to be spaced apart from both sides of the p-type well 41 as cathode regions (n-type drift layers), respectively. The p-type well 41 and the n-type wells 42 are formed in a quadrangular shape elongated in a length direction of the diode structure 40 in the plan view.

A $p^+$-type anode contact region 43 and $n^+$-type regions 44 disposed on both sides of the $p^+$-type anode contact region 43 are formed in a surface layer of the p-type well 41. $N^+$-type cathode contact regions 45 are formed in surface layers of the n-type wells 42. A surface of the n-type epitaxial layer 22 is covered with field oxide films 46, except for the $p^+$-type substrate contact region 27, the $n^+$-type layer 32, the $p^+$-type cathode contact region 35, the $n^+$-type cathode contact regions 45, portions close to the p-type well 41 in the upper surface of each of the n-type wells 42, and a region between the n-type wells 42.

The diode structure 40 additionally includes gate insulating films 47 and gate electrodes 48. The gate insulating films 47 are formed on a surface of the n-type epitaxial layer 22 in a region between each of the field oxide films 46, which are disposed between the $n^+$-type cathode contact regions 45 of the n-type wells 42 and the p-type well 41, and each of the $n^+$-type regions 44 within the p-type well 41 that is close to the associated field oxide film 46. The gate electrodes 48 are formed to cover the gate insulating films 47 and a portion of the field oxide films 46 disposed between the gate insulating films 47 and the $n^+$-type cathode contact regions 45.

The $p^+$-type anode contact region 43 of the p-type well 41 and the gate electrodes 48 are connected to an anode electrode 52. The $n^+$-type cathode contact regions 45 of the n-type wells 42 and the p+-type cathode contact region 35 within the p-type well (p-type guard ring) 34 are connected to a cathode electrode 53. A PN junction diode Di1 is formed by the p-type well 41, the n-type well 42 adjacent to one side of the p-type well 41, and the n-type epitaxial layer 22 between the p-type well 41 and the n-type well 42, while a PN junction diode Di2 is formed by the p-type well 41, the n-type well 42 adjacent to the other side of the p-type well 41, and the n-type epitaxial layer 22 between the p-type well 41 and the n-type well 42. Also, a PNP transistor Tr1 for reducing a leakage current is formed by the p-type well 41, the p-type guard ring (p-type well) 34, and the n-type epitaxial layer 22 between the p-type well 41 and the p-type guard ring (p-type well) 34.

When a forward bias is applied between the anode electrode 52 and the cathode electrode 53, a current flows from the anode electrode 52 to the cathode electrode 53 through the PN junction diodes and the PNP transistor Tr1 for reducing a leakage current. This diode 10 may be manufactured by a BiCDMOS (Bipolar CMOS DMOS) process. The p-type well 34 may be formed as a p-type guard ring through a process identical to that of the upper isolation region 26 of the p-type isolation region 23. In addition, the p⁺-type cathode contact region 35 within the p-type well 34 may be formed through a process identical to that of the p⁺-type substrate contact region 27 within the upper isolation region 26.

In the diode 10, a longitudinal parasitic PNP transistor Tr2 is formed by the p-type well 41, the p-type semiconductor substrate 21, and the n-type semiconductor (the n-type epitaxial layer 22 and the n-type buried layer 28) between the p-type well 41 and the p-type semiconductor substrate 21. Additionally, a transverse parasitic PNP transistor Tr3 is formed by the p-type well 41, the p-type isolation region 23, and the n-type epitaxial layer 22 between the p-type well 41 and the p-type isolation region 23.

An impurity concentration of the n-type buried layer 28 having a small thickness in a longitudinal direction may be set to be high. Thus, a current amplification factor hfe of the longitudinal PNP parasitic transistor Tr2 may be lowered such that a leakage current through the longitudinal PNP parasitic transistor Tr2 can be easily reduced. On the other hand, since the n-type collector wall 29 extends in a longitudinal direction (i.e., a normal direction of the surface of the p-type semiconductor substrate 21), it may be difficult to set a high impurity concentration across the entire region. Thus, a current amplification factor of the transverse PNP parasitic transistor Tr3 is higher than that of the longitudinal PNP parasitic transistor Tr2 such that a leakage current by the transverse PNP parasitic transistor Tr3 is greater than a leakage current by the longitudinal PNP parasitic transistor Tr2. Given those, in order to realize a diode having a small amount of leakage current, it is important to suppress a current, which flows in the transverse PNP parasitic transistor Tr3.

The PNP transistor Tr1 for reducing a leakage current is formed in the diode 10, separately from the longitudinal PNP parasitic transistor Tr2 and the transverse PNP parasitic transistor Tr3. In one embodiment, a current amplification factor of the PNP transistor Tr1 for reducing a leakage current is greater than that of the longitudinal PNP parasitic transistor Tr2. The p-type guard ring (p-type well) 34 is connected to the cathode electrode 53, and thus, a current, which flows in the PNP transistor Tr1 for reducing a leakage current, is collected in the cathode electrode 53.

The p-type guard ring (p-type well) 34, which has an annular shape as illustrated in the plan view and becomes a collector of the PNP transistor Tr1 for reducing a leakage current, is disposed on an inner side of the p-type isolation region 23, which has an annular shape as illustrated in the plan view and becomes a collector of the transverse parasitic PNP transistor Tr3. Thus, in the n-type epitaxial layer 22, currents that intend to flow from within the diode formation region 33 toward the p-type isolation region 23 are mostly collected in the cathode electrode 53 by means of the PNP transistor Tr1 for reducing a leakage current. Accordingly, a current flowing in the transverse parasitic PNP transistor Tr3 can be suppressed such that a diode having a small amount of leakage current can be realized.

Figure 4A:
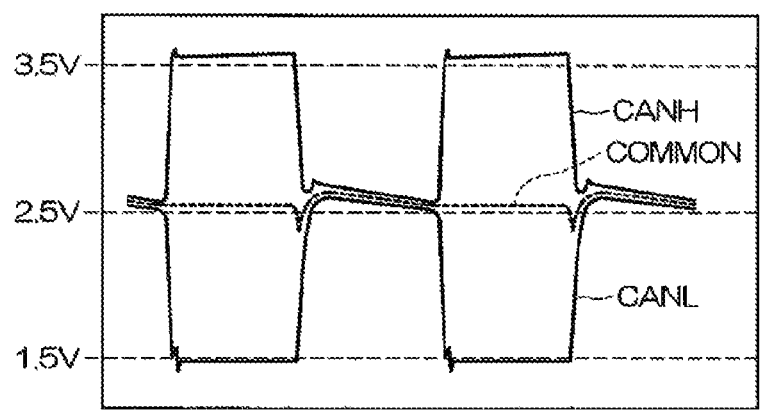
FIG. 4A illustrates a waveform view showing a result of measuring an output signal waveform of the signal output circuit of FIG. 1.

FIG. 4A illustrates a waveform view showing a result of measuring an output signal waveform of the signal output circuit 1 of FIG. 1. In FIG. 4A, CANH represents a bus signal waveform output at the high-side output terminal 5, while CANL represents a bus signal waveform output at the low-side output terminal 6. In FIG. 4A, COMMON represents a common voltage (i.e., CANH+CANL/2). If both driving transistors 7 and 12 are in an ON state, a value of the bus signal CANH becomes a value approximate to 3.5V of the standard value and a value of the bus signal CANL becomes a value approximate to 1.5V of the standard value. On the other hand, if the driving transistors 7 and 12 are in an OFF state, values of the bus signal CANH and the bus signal CANH become values approximating to 2.5V of the standard value. In addition, a difference between a common voltage COMMON in an ON state of the driving transistors 7 and 12 and a common voltage COMMON in an OFF state of the driving transistors 7 and 12 is small.

Figure 4B:
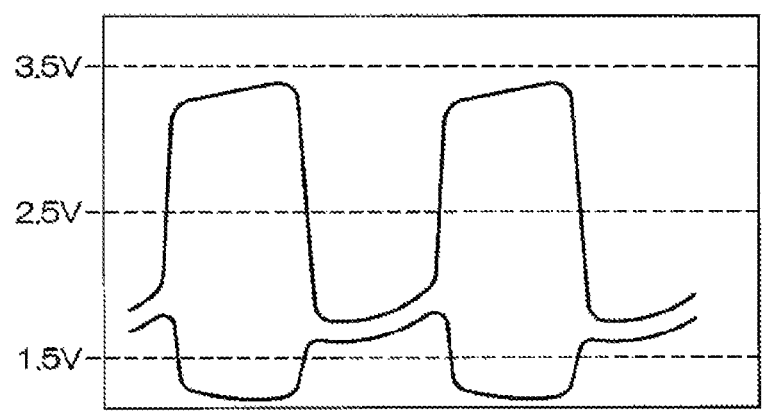
FIG. 4B illustrates a waveform view showing a result of measuring an output signal waveform of a signal output circuit in case of using a comparative example instead of a diode within a low-side output unit of the signal output circuit of FIG. 1.

A diode, which has a structure formed by removing the p-type guard ring (p-type well) 34 from the diode 10 illustrated in FIG. 3, will be used as a comparative example. Output signal waveforms were measured based on the comparative example, instead of the diode 10 in the signal output circuit 1 of FIG. 1. FIG. 4B illustrates a waveform view showing the measurement results in case of the comparative example. In FIG. 4B, it can be seen that the bus signals deviate from the standard values. In particular, it can be seen that the bus signals in an OFF state of the driving transistors 7 and 12 are significantly reduced relative to the standard value (2.5V), reaching a value approximate to 1.5V.

Figure 5:
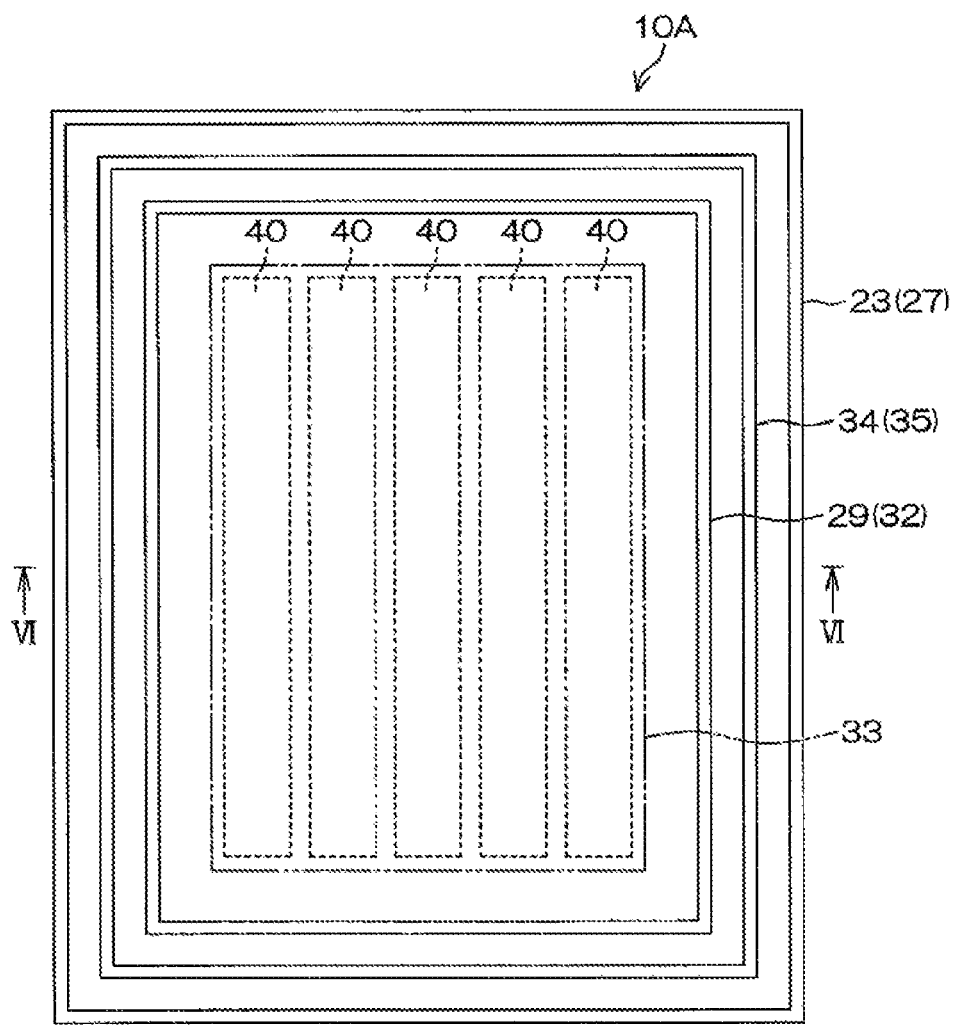
FIG. 5 illustrates a schematic plan view indicative of a structure of a diode according to a second embodiment of the present disclosure.
Figure 6:
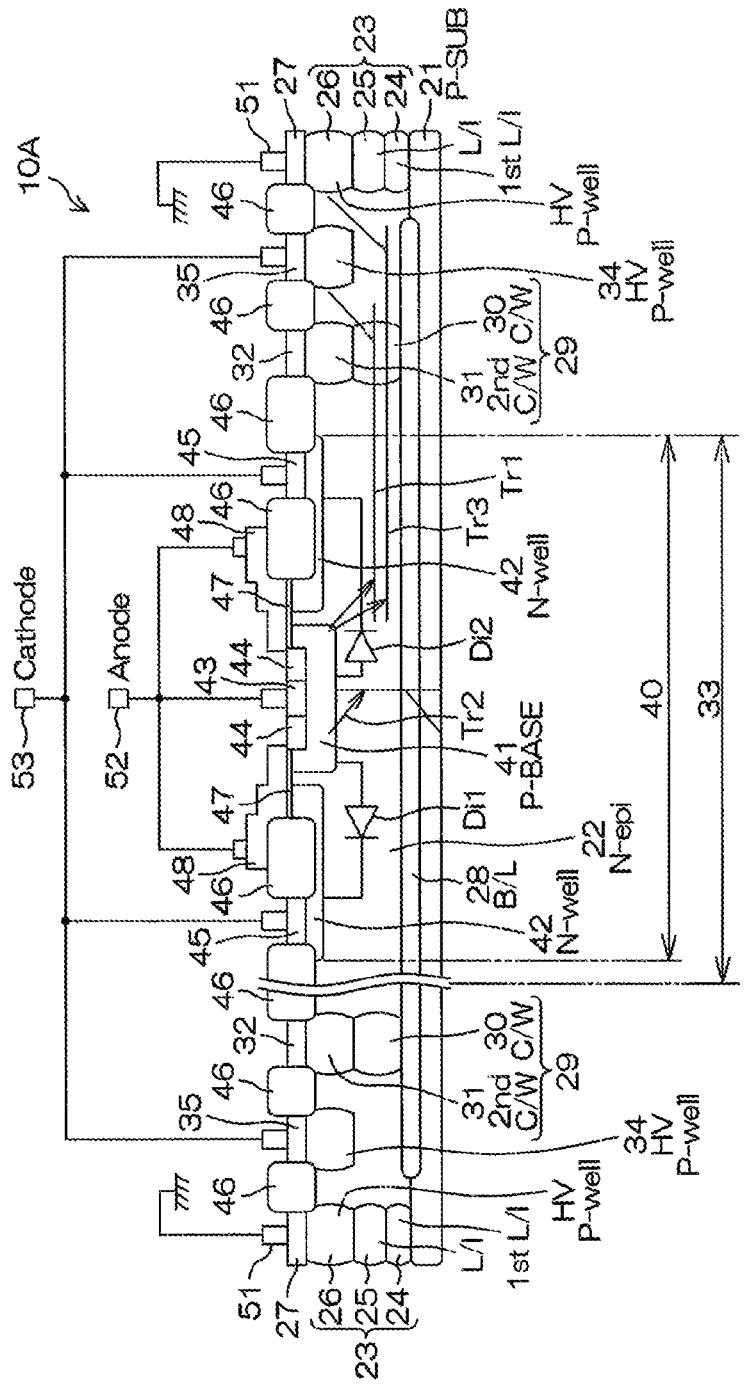
FIG. 6 illustrates a schematic cross-sectional view showing a structure of the diode taken along line VI-VI of FIG. 5.

FIG. 5 illustrates a schematic plan view indicative of a structure of a diode 10A according to a second embodiment of the present disclosure, and FIG. 6 illustrates a cross-sectional view taken along line VI-VI of FIG. 5. In FIGS. 5 and 6, the same reference numerals as those of FIGS. 2 and 3 will be used for components corresponding to those of FIGS. 2 and 3 as described above. When compared with the diode 10 in FIGS. 2 and 3 of the first embodiment, in the diode 10A of the second embodiment of the present disclosure, relative positional relations of the p-type well 34 serving as a p-type guard ring and the n-type collector wall 29 are reversed. Except for this, the diode 10A is identical to the diode 10. Specifically, in the diode 10 of the first embodiment, the p-type well 34 is formed as a p-type guard ring in a region between the diode formation region 33 and the n-type collector wall 29 to surround the diode formation region 33. On the other hand, in the diode 10A of the second embodiment, the p-type well 34 is formed as a p-type guard ring in a region between the n-type collector wall 29 and the p-type isolation region 23 to surround the diode formation region 33 (n-type collector wall 29) in an outer side of the n-type collector wall 29.

In the diode 10A of the second embodiment, a diode having a small amount of leakage current can be realized through an operation identical to that of the diode 10 of the first embodiment. As can be seen from the first and second embodiments described above, it may be desirable for the p-type well 34 to be formed as a p-type guard ring in a region between the diode formation region 33 and the p-type isolation region 23 for surrounding the diode formation region 33.

Figure 7:
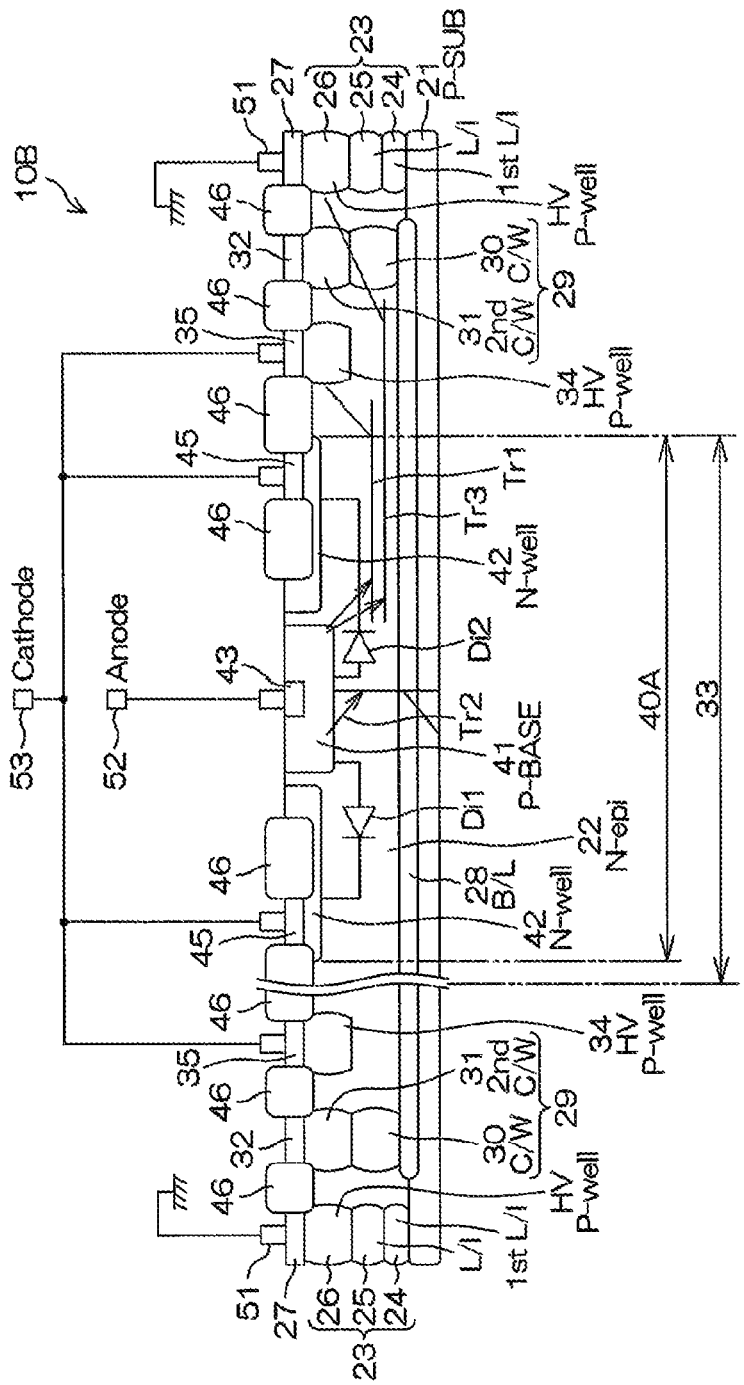
FIG. 7 illustrates a schematic cross-sectional view indicative of a structure of a diode according to a third embodiment of the present disclosure.

FIG. 7 is a schematic cross-sectional view indicative of a structure of a diode 10B according to a third embodiment of the present disclosure. In FIG. 7, the same reference numerals as those of FIG. 3 will be used for components corresponding to those of FIG. 3 described above. The diode 10B of the third embodiment is similar to the diode 10 of the first embodiment in FIGS. 2 and 3. The diode 10B of the third embodiment is identical to the diode 10 of the first embodiment, except for a configuration of a diode structure 40A.

The diode structure 40A of the diode 10B in the third embodiment includes a p-type well (P-BASE) 41 formed in a surface layer of the n-type epitaxial layer 22 as an anode region and two n-type wells (N-wells) 42 formed to be spaced apart from both sides of the p-type well 41 as cathode regions, respectively, in the same configuration as the diode structure 40 of the diode 10 in the first embodiment,. The p⁺-type anode contact region 43 is formed in a surface layer of the p-type well 41. The p⁺-type anode contact region 43 is connected to the anode electrode 52. The n⁺-type cathode contact regions 45 are formed in surface layers of the n-type wells 42. The n+-type cathode contact regions 45 are connected to the cathode electrode 53.

On the other hand, in the diode structure 40A of the diode 10B in the third embodiment, the n+-type regions 44, which are described in the first embodiment, are not formed in the surface layer of the p-type well 41. Additionally, the gate insulating films 47 and the gate electrodes 48, which are described in the first embodiment, are not installed in the diode structure 40A of the diode 10B. The diode 10B of the third embodiment can also realize a diode having a small amount of leakage current through an operation identical to that of the diode 10 in the first embodiment.

Figure 8:
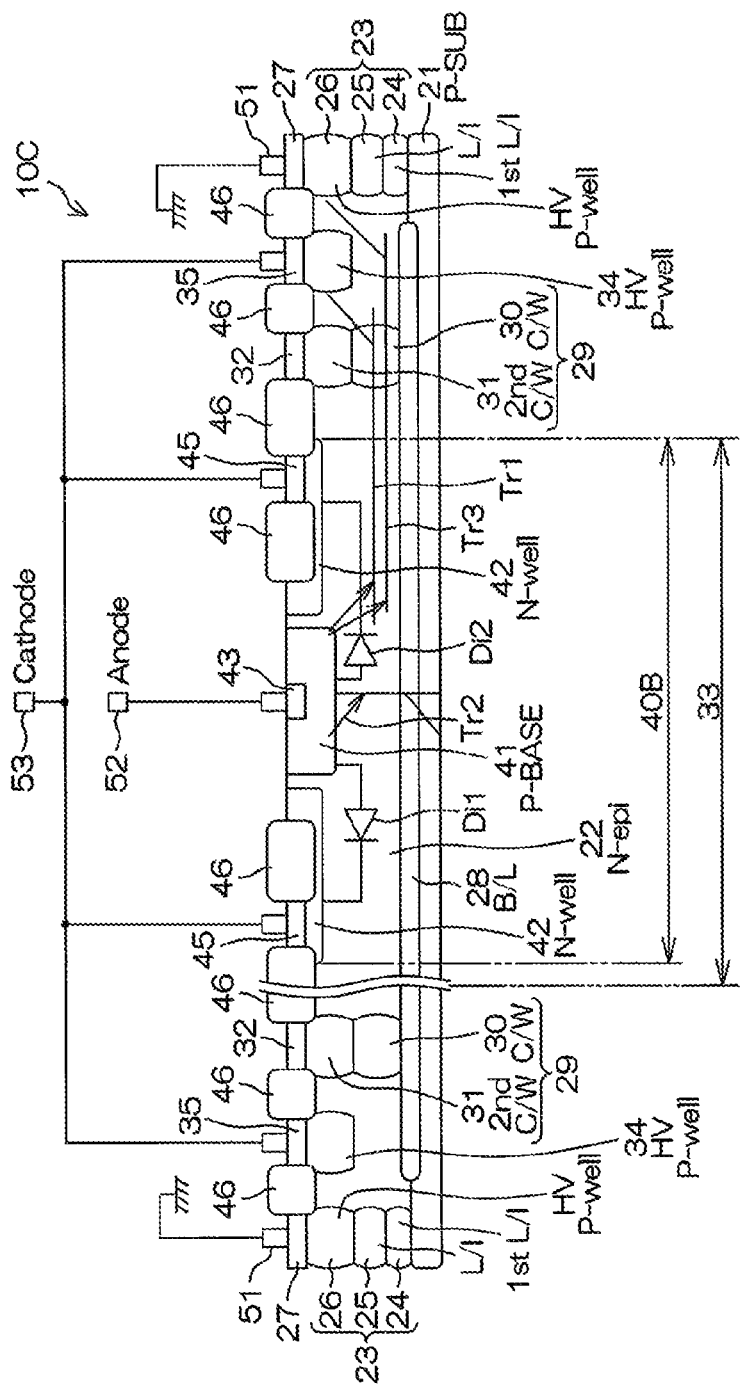
FIG. 8 illustrates a schematic cross-sectional view indicative of a structure of a diode according to a fourth embodiment of the present disclosure.

FIG. 8 is a schematic cross-sectional view indicative of a structure of a diode 10C, according to a fourth embodiment of the present disclosure. In FIG. 8, the same reference numerals as those of FIG. 3 will be used for components corresponding to those of FIG. 3 described above. The diode 10C of the fourth embodiment is similar to the diode 10A according to the second embodiment in FIGS. 5 and 6. The diode 10C of the fourth embodiment is identical to the diode 10A of the second embodiment, except for a configuration of a diode structure 40B. The diode structure 40B of the diode 10C in the fourth embodiment has a configuration identical to that of the diode structure 40A of the diode 10B in the third embodiment described above with reference to FIG. 7.

That is, the diode structure 40B of the diode 10C in the fourth embodiment includes a p-type well (P-BASE) 41 formed in a surface portion of the n-type epitaxial layer 22 as an anode region, and two n-type wells (N-wells) 42 formed to be spaced apart from both sides of the p-type well 41 as cathode regions, respectively. The p+-type anode contact region 43 is formed in a surface layer of the p-type well 41. The p+-type anode contact region 43 is connected to the anode electrode 52. The n+-type cathode contact regions 45 are formed in surface layers of the n-type wells 42. The n+-type cathode contact regions 45 are connected to the cathode electrode 53.

On the other hand, in the diode structure 40B of the diode 10C in the fourth embodiment, the n+-type regions 44, which are described in the first embodiment, are not formed in the surface layer of the p-type well 41. Additionally, the gate insulating films 47 and the gate electrodes 48, which are described in the first embodiment, are not installed in the diode structure 40B of the diode 10C. The diode 10C of the fourth embodiment may also realize a diode having a small amount of leakage current through an operation identical to that of the diode 10A in the second embodiment.

As described above, the embodiments in case that the present disclosure is applied to the diodes for a signal output circuit used in a CAN have been described, but the present disclosure may also be applied to a diode for a signal output circuit used in any other vehicle-mounted network (e.g., a local interconnect network (LIN), FlexRay, and the like), a diode for a vehicle-mounted switch IC, a diode for a DC/DC converter, etc. In addition, the present disclosure may be applied to a diode used in a circuit other than a vehicle-mounted circuit, etc.

Figure 9:
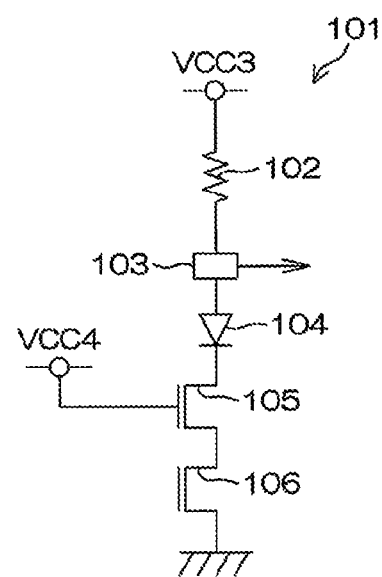
FIG. 9 illustrates an electrical circuit diagram showing an example in case that the present disclosure is applied to a signal output circuit used in a LIN.

FIG. 9 is an electrical circuit diagram showing an example in case that the present disclosure is applied to a signal output circuit used in a LIN. The signal output circuit 101 includes a resistor 102, an output terminal 103, a backflow prevention diode 104, a protection transistor 105, and a driving transistor 106. One end of the resistor 102 is connected to a third power source VCC3, and the other end of the resistor 102 is connected to the output terminal 103. An anode of the backflow prevention diode 104 is connected to the output terminal 103, and a cathode of the backflow prevention diode 104 is connected to a drain of the protection transistor 105. A source of the protection transistor 105 is connected to a drain of the driving transistor 106. A source of the driving transistor 106 is grounded. A base of the protection transistor 105 is connected to a fourth power source VCC4. The output terminal 103 is connected to a bus line.

When the driving transistor 106 is turned on, a low level bus signal is output at the output terminal 103. On the other hand, when the driving transistor 106 is turned off, a high level bus signal is output at the output terminal 103. When there is much leakage current from the backflow prevention diode 104, a current flows from the output terminal 103 to a ground through the backflow prevention diode 104, even though the driving transistor 106 is turned off. As such, a voltage output at the output terminal 103 deviates from a standard value. Thus, the diodes in the embodiments described above are used as the backflow prevention diode 104.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A diode, comprising:
a p-type semiconductor substrate;
an n-type semiconductor layer formed on the p-type semiconductor substrate;
a p-type isolation region formed to surround a predetermined region of the n-type semiconductor layer on the p-type semiconductor substrate;
an n-type buried layer formed across the p-type semiconductor substrate and the n-type semiconductor layer within the predetermined region, the n-type buried layer having an impurity concentration higher than an impurity concentration of the n-type semiconductor layer;
an n-type collector wall formed in the n-type semiconductor layer, the n-type collector wall standing on the n-type buried layer toward a surface of the n-type semiconductor layer to surround the predetermined region of the n-type semiconductor layer, and having an impurity concentration higher than the impurity concentration of the n-type semiconductor layer;
a p-type anode region and a plurality of n-type cathode regions formed in a diode formation region, which is defined within a region surrounded by the n-type collector wall in a surface layer of the n-type semiconductor layer; and
a p-type guard ring formed to surround the diode formation region in a region between the diode formation region of the surface layer of the n-type semiconductor layer and the p-type isolation region, the p-type guard ring being electrically connected to the plurality of n-type cathode regions,
wherein a transistor for reducing a leakage current is formed by the p-type anode region, the p-type guard ring, and an n-type semiconductor between the p-type anode region and the p-type guard ring.

2. The diode of claim 1, wherein the p-type guard ring is formed to surround the diode formation region in a region between the diode formation region of the surface layer of the n-type semiconductor layer and the n-type collector wall, and
wherein the n-type semiconductor comprises the n-type semiconductor layer.

3. The diode of claim 1, wherein the p-type guard ring is formed to surround the diode formation region in a region between the n-type collector wall and the p-type isolation region, and
wherein the n-type semiconductor comprises the n-type semiconductor layer and the n-type collector wall.

4. The diode of claim 1, wherein a longitudinal parasitic PNP transistor is formed by the p-type anode region, the p-type semiconductor substrate, and the n-type semiconductor layer and the n-type buried layer between the p-type anode region and the p-type semiconductor substrate, and
wherein a transverse parasitic PNP transistor is formed by the p-type anode region, the p-type isolation region, and the n-type semiconductor layer and the n-type collector between the p-type anode region and the p-type isolation region.

5. The diode of claim 4, wherein a current amplification factor of the transverse parasitic PNP transistor is higher than a current amplification factor of the longitudinal parasitic PNP transistor.

6. The diode of claim 4, wherein a current amplification factor of the transistor for reducing a leakage current is higher than a current amplification factor of the longitudinal parasitic PNP transistor.

7. The diode of claim 1, wherein a diode structure including the p-type anode region and the n-type cathode regions is formed in the diode formation region, the diode structure having an n-channel DMIS transistor structure.

8. The diode of claim 7, wherein the diode structure comprises:
the p-type anode region formed in the surface layer of the n-type semiconductor layer;
an n-type region and a p-type contact region formed in a surface layer of the p-type anode region;
the n-type cathode regions formed in the surface layer of the n-type semiconductor layer and disposed to be spaced apart from both sides of the p-type anode region;
an n-type contact region formed in surface layers of the n-type cathode regions;
a gate insulating film formed on a surface of the n-type semiconductor layer in a region between the n-type region and the n-type contact region; and
a gate electrode formed on the gate insulating film and electrically connected to the p-type anode region.

9. A signal output circuit, comprising:
an output terminal;
a diode of claim 1, wherein an anode of the diode is connected to the output terminal; and
a switching element connected between a cathode of the diode and a ground.

* * * * *